United States Patent
Shih

(10) Patent No.: US 8,108,334 B2
(45) Date of Patent: Jan. 31, 2012

(54) SEARCH CIRCUIT IN DECODING UNIT OF LOW-DENSITY PARITY-CHECK CODES AND METHOD THEREOF

(75) Inventor: Chih-Yung Shih, Taipei (TW)

(73) Assignee: Realtek Semiconductor Corp., Hsinchu (TW)

( * ) Notice: Subject to any disclaimer, the term of this patent is extended or adjusted under 35 U.S.C. 154(b) by 750 days.

(21) Appl. No.: 12/022,449

(22) Filed: Jan. 30, 2008

(65) Prior Publication Data

US 2008/0189234 A1 Aug. 7, 2008

(51) Int. Cl.
*G06F 15/00* (2006.01)
*G06F 15/18* (2006.01)
*G06F 15/16* (2006.01)
*G06F 11/00* (2006.01)
*G06F 11/30* (2006.01)
*G08C 25/00* (2006.01)
*H03M 13/00* (2006.01)
*H04L 1/00* (2006.01)

(52) U.S. Cl. ............................ 706/62; 709/231; 714/746

(58) Field of Classification Search .................. None
See application file for complete search history.

(56) References Cited

U.S. PATENT DOCUMENTS

| 2007/0283213 | A1* | 12/2007 | Liao et al. | ................. | 714/758 |
| 2008/0263123 | A1* | 10/2008 | Penzes | .................. | 708/671 |
| 2008/0301521 | A1* | 12/2008 | Gunnam et al. | ............... | 714/757 |

OTHER PUBLICATIONS

Gunnam, Kiran K et al.; "A Parallel VLSI Architecture for Layered Decoding" (http://dropzone.tamu.edu/techpubs/2007/TAMU-ECE-2007-05.pdf); Created Oct. 2, 2006; pp. 1-54.*
Gunnam, Kiran K. et al.; "A Parallel VLSI Architecture for Layered Decoding for Array LDPC Codes"; Jan. 6-10, 2007; International Conference on VLSI Design (VLSID'07); pp. 1-6.*
Knuth, D. E.; "The Art of Computer Programming"; 1973; Addison Wesley, vol. 3; pp. 142-145.*

* cited by examiner

Primary Examiner — Jeffrey A Gaffin
Assistant Examiner — Stanley K Hill
(74) Attorney, Agent, or Firm — Thomas, Kayden, Horstemeyer & Risley, LLP

(57) ABSTRACT

The present invention relates to a search circuit in a decoding unit of low-density parity-check codes, which used for searching a minimum value and a next minimum value from r input values, where r is an integer greater than 3. The search circuit includes a first search circuit and a second search circuit. The search method includes performing operations on each pair of input values Vi, Vj of the r input values, respectively. The second search circuit, which is coupled to the first search circuit, performs operations on every two sets of compared values Wm, Lm, and Wn, Ln of the s compared values, where s is a positive integer smaller than r, the smaller value Wm is smaller than the greater value Lm, and the smaller value Wn is smaller than the greater value Ln. The second search circuit performs operations according to the smaller value Wo and the greater value Lo to produce the minimum value and the next minimum value. Thereby, the search of the minimum value, the next minimum value, and the address of the minimum value can be performed at the same time without the need of waiting completion of search for the minimum value then the next minimum value can be searched.

16 Claims, 9 Drawing Sheets

SEARCH CIRCUIT IN DECODING UNIT OF LOW-DENSITY PARITY-CHECK CODES AND METHOD THEREOF

FIELD OF THE INVENTION

The present invention related generally to a search circuit, and particularly to a search circuit in a decoding unit of low-density parity-check codes and a method thereof.

BACKGROUND OF THE INVENTION

For data transmission systems, for example, communication systems or digital storage systems, the transmitted signals from a transmitter are prone to influences of noises. Thereby, received signals at a receiver include error data. In order to solve the problem, according to the prior art, data to be transmitted and extra data are encoded to signals to be transmitted from the transmitter. The receiver then decodes the received signals according to corresponding decoding method, and thereby acquires exact data. The method described above is named forward error control (FEC) method. In various FEC methods, low-density parity-check codes are codes usually used.

Low-density parity-check codes, which are a kind of block codes, are proposed by R. G. Gallager in 1963. An (n, k) 2-bit linear low-density parity-check code is defined, where n is the length of the block code and k is the bit-length of a message within the block code. Moreover, a parity-check matrix H, which is a M-by-N matrix, is simplified to be a (n-k)-by-n sparse matrix. The number of elements with value 1 in each row and column of the parity-check matrix is very small with respect to the length of the block code n. Thereby, the codes are named as low-density parity-check codes.

FIG. 1 shows a block diagram of a transmission system with low-density parity-check codes according to a preferred embodiment of the present invention. As shown in the figure, the transmission system includes a transmission apparatus 1' and a receiving apparatus 2'. The transmission apparatus 1' includes an encoding unit 10' and a modulation unit 12'. The encoding unit encodes data; the modulation unit 12' modulates encoded data by the encoding unit 10', and transmits it to the receiving apparatus 2'. The receiving apparatus 2' includes a demodulation unit 20' and a decoding unit 22'. The demodulation unit 20' demodulates the data transmitted by the transmitting apparatus 1' according to the corresponding modulation method of the modulation unit 12'. Then, the decoding unit 22' decodes the data demodulated by the demodulation unit 20' to recover required data.

The encoding unit 10' adopts low-density parity-check codes for encoding. The low-density parity-check encoding method is the same as the general block encoding. A codeword vector is given by multiplying the message passing sent into the encoding unit 10' by a codeword generator matrix. In addition, the multiplication of the transposes of the codeword vector (a row matrix) and of the parity-check matrix is zero, that is, $C^T \cdot H^T = 0$. (Alternatively, the multiplication of the parity-check matrix and the codeword vector (a column matrix) is zero, that is, $H \cdot C = 0$.) If the received codeword is affected by channel noises, then the multiplication of the transposes of the received codeword and of the parity-check matrix is no longer a zero vector, and is defined as a syndrome vector. Checking if the syndrome vector is zero tells if the received codeword is correct or not.

In addition, the decoding unit 22' uses the decoding method of low-density parity-check codes. Low-density parity-check coding is an application of belief propagation (BP) algorithm, which uses the message passing between message nodes and check nodes as repeated decoding. FIG. 2 shows the decoding procedure of low-density parity-check codes. At first, use the received codeword vector to initialize the posterior probability of the message nodes. Then, update the probabilities of the message nodes and the check nodes repeatedly. Finally, calculate the confidence of the message nodes to make decoding decision $\hat{x}$. If the multiplication of the decoding decision $\hat{x}$ and the transpose of the parity-check matrix is zero, that is, $\hat{x} \cdot H^T = 0$, then the decoding is successful. Otherwise, if the maximum number of repeat is reached, the decoding is failed; if the maximum number of repeat is not reached yet, continue updating repeatedly until decoding is successful or the maximum number of repeat is reached.

In the process of the BP-based algorithm according to the prior art, the minimum and the next minimum values of r input values are used for calculation to produce r output values. According to the prior art, the method to get the minimum and the next minimum values from r input values is: compare to get a minimum value from r input values; then, use the other values to compare and search a next minimum value. That is, the minimum value is searched first, and then the next minimum value is searched.

Related prior arts can be referred as follows:
1. J. Chen et al., "Reduced-Complexity Decoding of LDPC Codes", IEEE Trans. On Communications, vol. 53, No. 8, pp. 1288-1299, 2005;
2. D. E. Kunth, The Art of Computer Programming. Reading, Mass.: Addison Wesley, 1973, vol. 3, pp. 209-242; and
3. U.S. Patent Pub. No. U.S.2004/0153959 A1 "LDPC Decoding Apparatus and Method".

SUMMARY

The objective of the present invention is to provide a search circuit in a decoding unit of low-density parity-check codes used for searching the minimum and the next minimum values from r input values.

Another objective of the present invention is to provide a search circuit in a decoding unit of low-density parity-check codes used for searching the minimum value, the next minimum value, and the address of the minimum value from r input values.

The search circuit in a decoding unit of low-density parity-check codes according to the present invention includes a first search circuit and a second search circuit. The search method is to search a minimum and a next minimum values from r input values, where r is an integer greater than 3. Firstly, the first search circuit performs operations on each pair of input values Vi, Vj of the r input values, respectively. The second search circuit, which is coupled to the first search circuit, performs operations on every two sets of compared values Wm, Lm, and Wn, Ln of the s compared values, where s is a positive integer smaller than r, the smaller value Wm is smaller than the greater value Lm, and the smaller value Wn is smaller than the greater value Ln. The second search circuit performs operations according to the smaller value Wo and the greater value Lo to produce the minimum value and the next minimum value.

DETAILED DESCRIPTION

In order to make the structure and characteristics as well as the effectiveness of the present invention to be further understood and recognized, the detailed description of the present invention is provided as follows along with preferred embodiments and accompanying figures.

Figure 1:
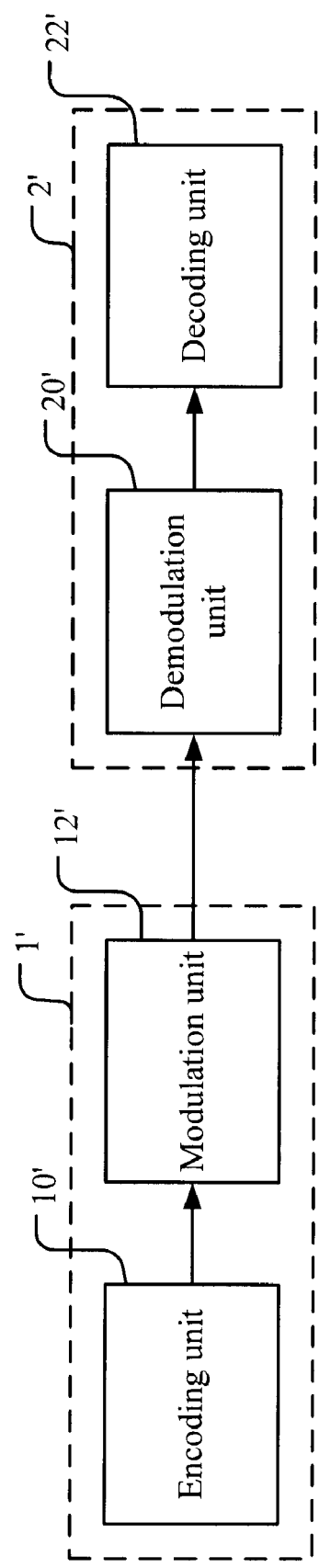
FIG. 1 shows a block diagram of a transmission system with low-density parity-check codes according to a preferred embodiment of the present invention.
Figure 2:
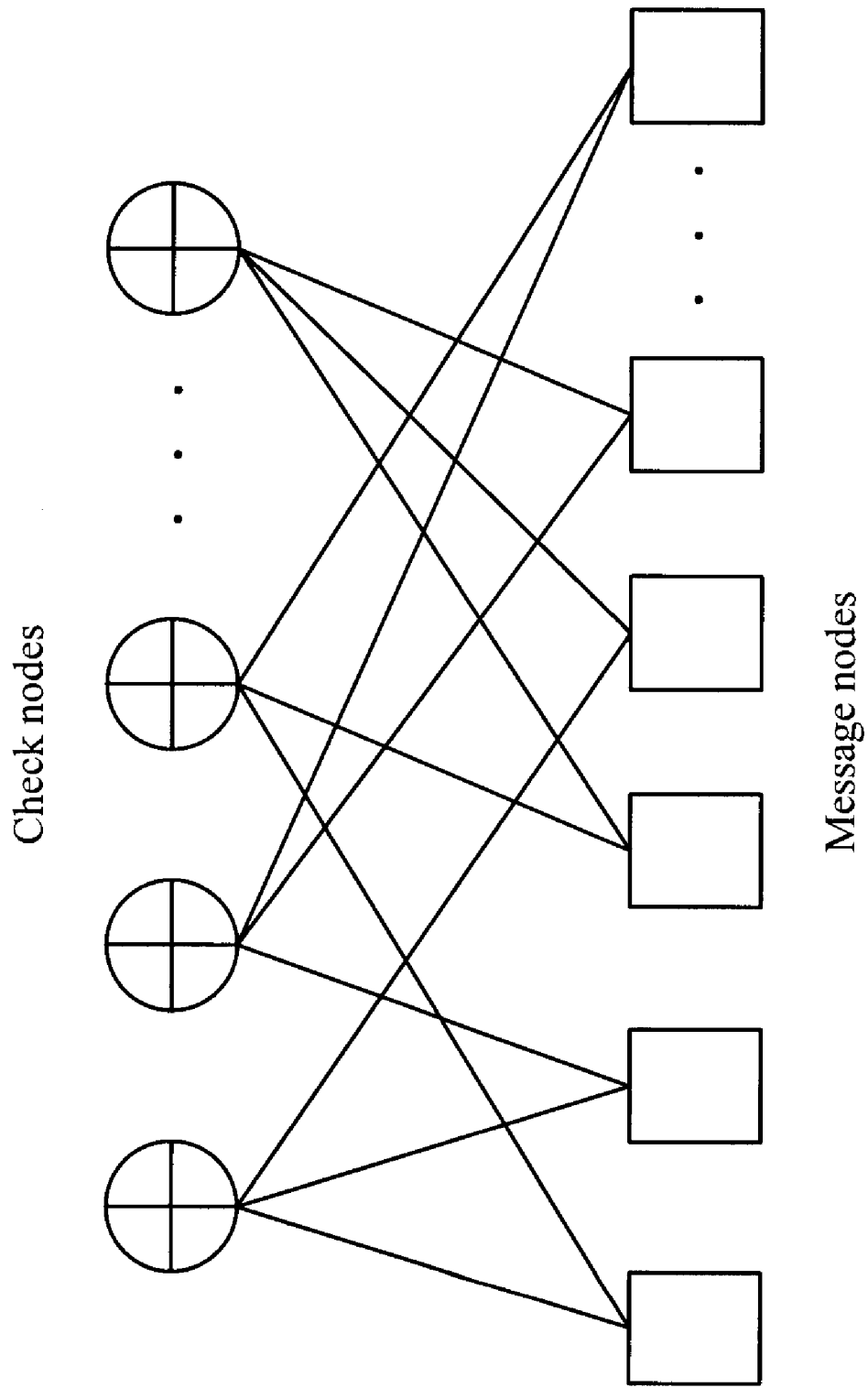
FIG. 2 shows relationship between check nodes and message nodes.
Figure 3A:
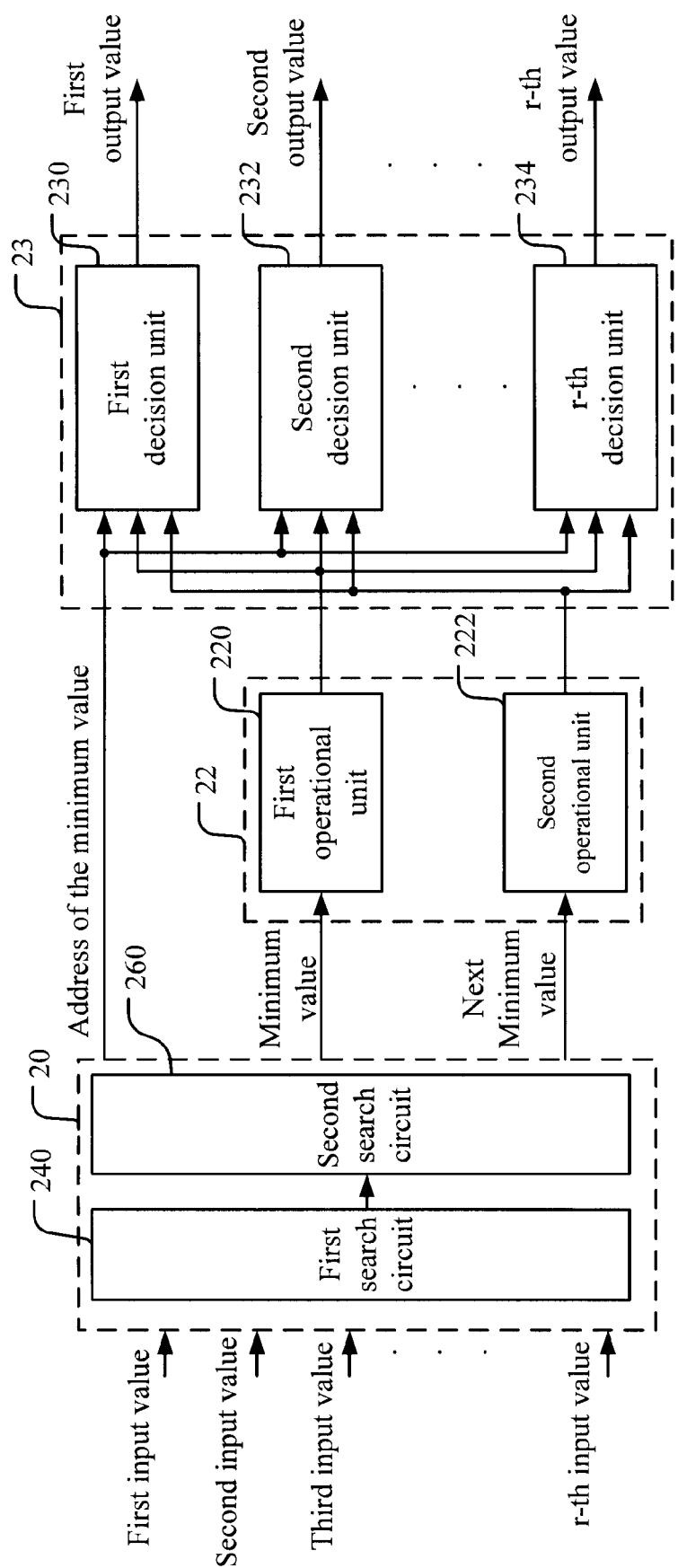
FIG. 3A shows an update block diagram of check nodes of a belief-propagation-based decoding unit according to a preferred embodiment of the present invention.

FIG. 3A shows an update block diagram of check nodes of a belief-propagation-based decoding unit according to a preferred embodiment of the present invention. As shown in the figure, the update structure of the check nodes includes a search circuit 20, an operation module 22, and a decision module 23. The search circuit 20 receives data, which is matrix data, decoded by the decoding unit. Besides, the search circuit 20 receives the column matrix data of the matrix data sequentially, and compares to give the minimum value, the next minimum value, and the address of the minimum value of the column matrix. The operation module 22 use BP-based algorithm to update data of the check nodes. Three methods are includes: normalized BP-based decoding, offset BP-based decoding, and BP-based approximation decoding, which is also called min-sum decoding. The operation module 22 receives the minimum and the next minimum values output by the search circuit 20, and includes a first operation unit 220 and a second operation unit 222. The first operation unit 220 receives the minimum value, while the second operation unit 222 receives the next minimum value. According to system requirements, one of the normalized BP-based decoding, the offset BP-based decoding, and the BP-based approximation decoding is selected. The decision module 23 includes a first decision unit 230, a second decision unit 232 . . . , and an r-th decision unit 234 (r is a positive integer) used for outputting a first output value, a second output value . . . , and an r-th output value, respectively. A preferred embodiment of the operational steps of each of the decision unit is described as follows:

Step 1: Receive the minimum value, the next minimum value, and the address of the minimum value;

Step 2: If the r-th address is the address of the minimum value, output the output value of the second operation unit to be the r-th output value; and Step 3: If the r-th address is not the address of the minimum value, output the output value of the first operation unit to be the r-th output value.

Figure 3B:
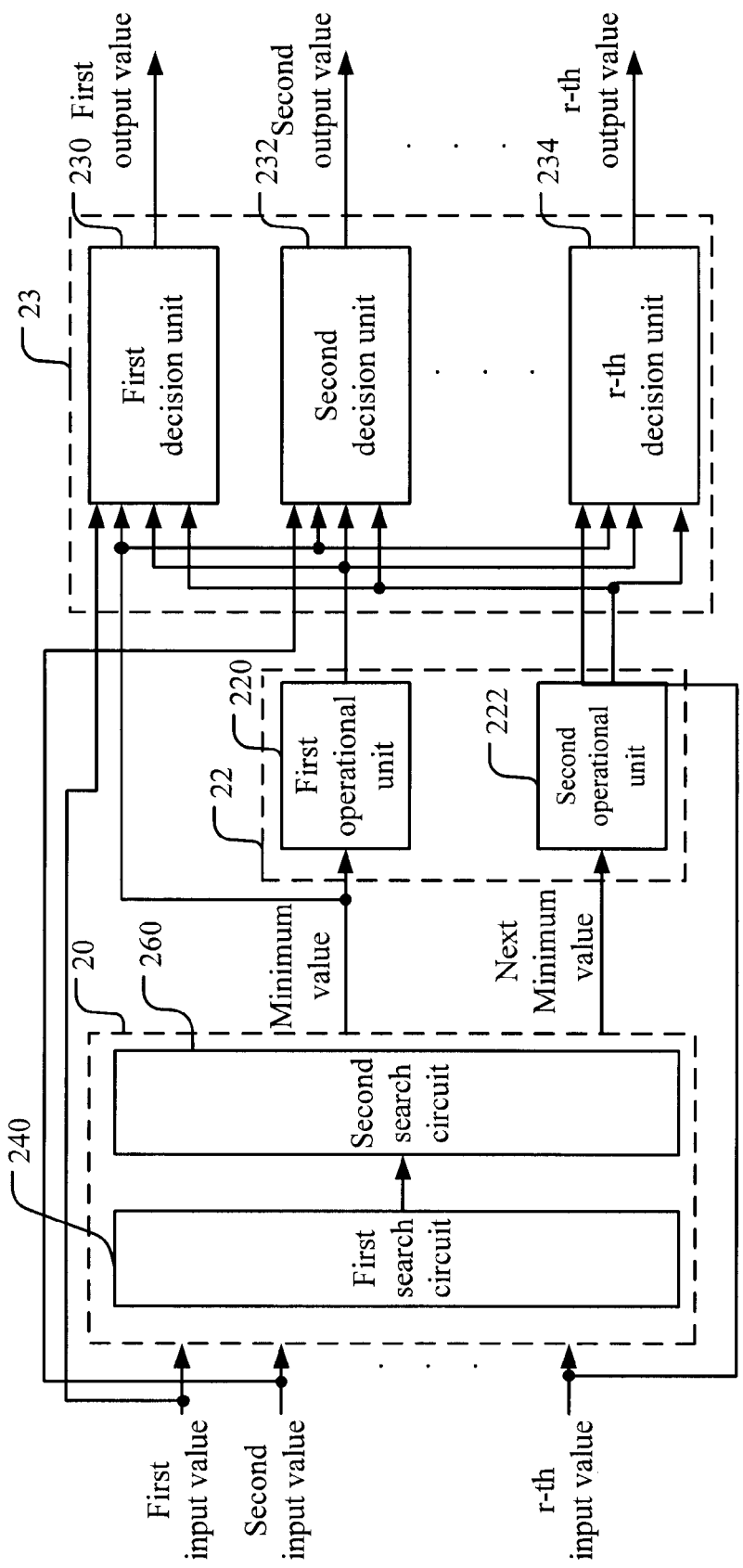
FIG. 3B shows another update block diagram of check nodes of a belief-propagation-based decoding unit according to another preferred embodiment of the present invention.

FIG. 3B shows another update block diagram of check nodes of a belief-propagation-based decoding unit according to another preferred embodiment of the present invention. As shown in the figure, the difference between the figure and FIG. 3A is that the operational steps of each decision unit of the decision module 23 is described as follows:

Step 1: Receive the minimum value, the next minimum value, and the r-th input value;

Step 2: If the r-th input value is the minimum value, output the output value of the second operation unit to be the r-th output value; and Step 3: If the r-th input value is not the minimum value, output the output value of the first operation unit to be the r-th output value.

Figure 4A:
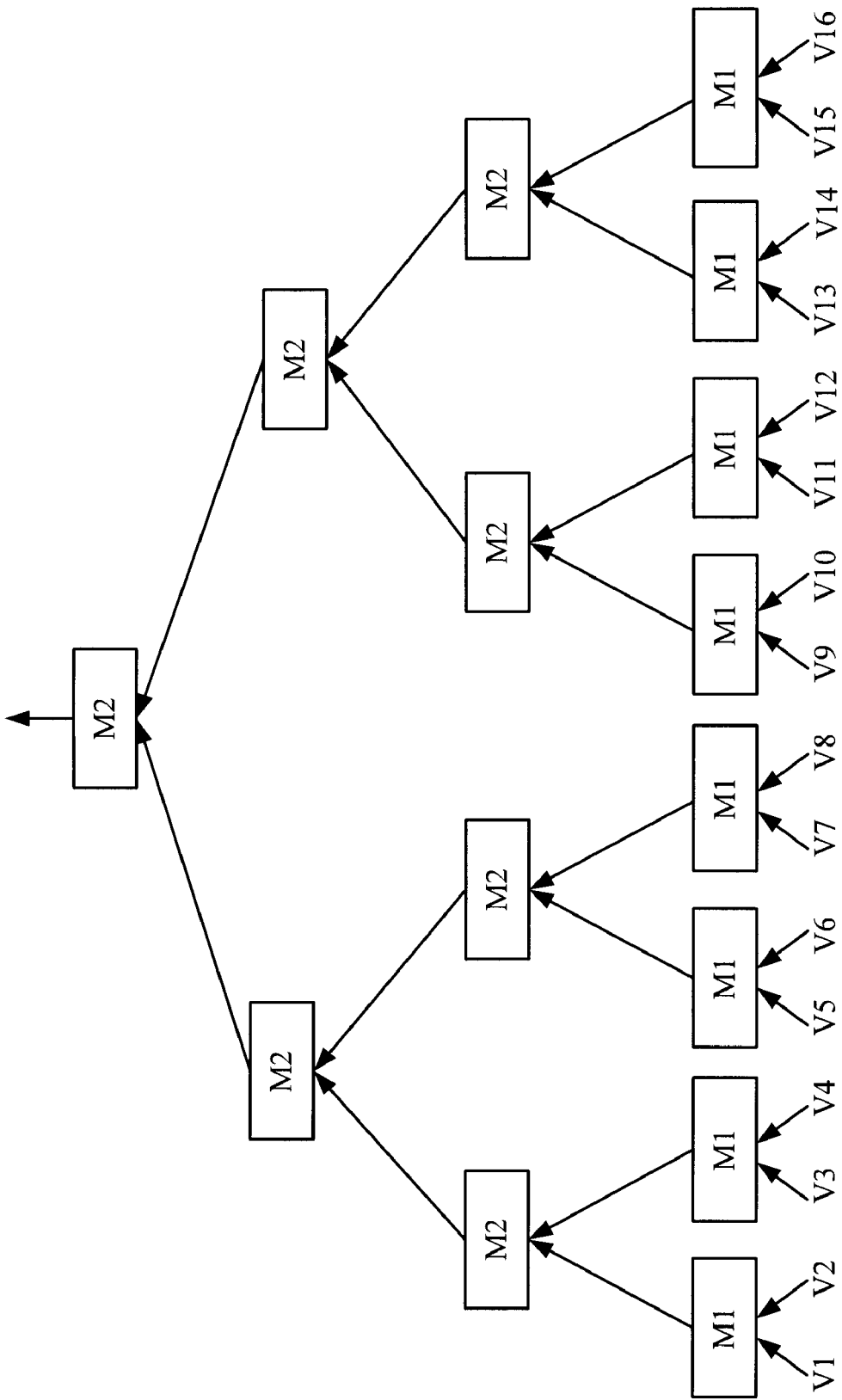
FIG. 4A shows a tree diagram of a search method according to a preferred embodiment of the present invention.

FIG. 4A shows a tree diagram of a search method according to a preferred embodiment of the present invention. As shown in the figure, the search circuit 20 receives the column matrix data of the matrix data $V_1(1), V_2(2) \ldots , V_{16}(16)$, where the values in parentheses represent addresses of the data. In addition, the blocks labeled with M1 perform the following operational steps:

Step 1: Receive the i-th input value Vi, the j-th input value Vj, the address Pi of the i-th input value Vi, and the address Pj of the j-th input value Vj, where i and j are positive integers not greater than r;

Step 2: Compare Vi and Vj; and

Step 3: If Vi is smaller than Vj, Vi is regarded as the smaller value Wk, Vj is regarded as the greater value Lk, and Pi is regarded as the address Pk of the smaller value; if Vj is smaller than Vi, Vj is regarded as the smaller value Wk, Vi is regarded as the greater value Lk, and Pj is regarded as the address Pk of the smaller value.

Besides, the blocks labeled with M2 in FIG. 4A receive two sets of the smaller values Wk, the addresses of the smaller values Pk, and the greater values Lk output by M1 blocks, respectively, as the input signals of the M2 blocks. The M2 blocks perform the following operational steps:

Step 1: Receive the m-th smaller value Wm, the m-th greater value Lm, the n-th smaller value Wn, the n-th greater value Ln, the address Pm of the m-th smaller value Wm, and the address Pn of the n-th smaller value Wn, where m and n are positive integers not greater than r;

Step 2: Compare Wm and Wn;

Step 3: If Wm is smaller than Wn, the following sub-steps are executed:

Step a: Regard Wm as the smaller value Wo;

Step b: Compare Lm and Wn, and regard the smaller value of the two as the greater value Lo of values smaller than Wm;

Step c: Regard Pm as the address Po of the smaller value;

Step 4: If Wn is smaller than Wm, the following sub-steps are executed:

Step d: Regard Wn as the smaller value Wo;

Step e: Compare Ln and Wm, and regard the smaller value of the two as the greater value Lo of values smaller than Wn; and Step f: Regard Pn as the address Po of the smaller value.

Figure 4B:
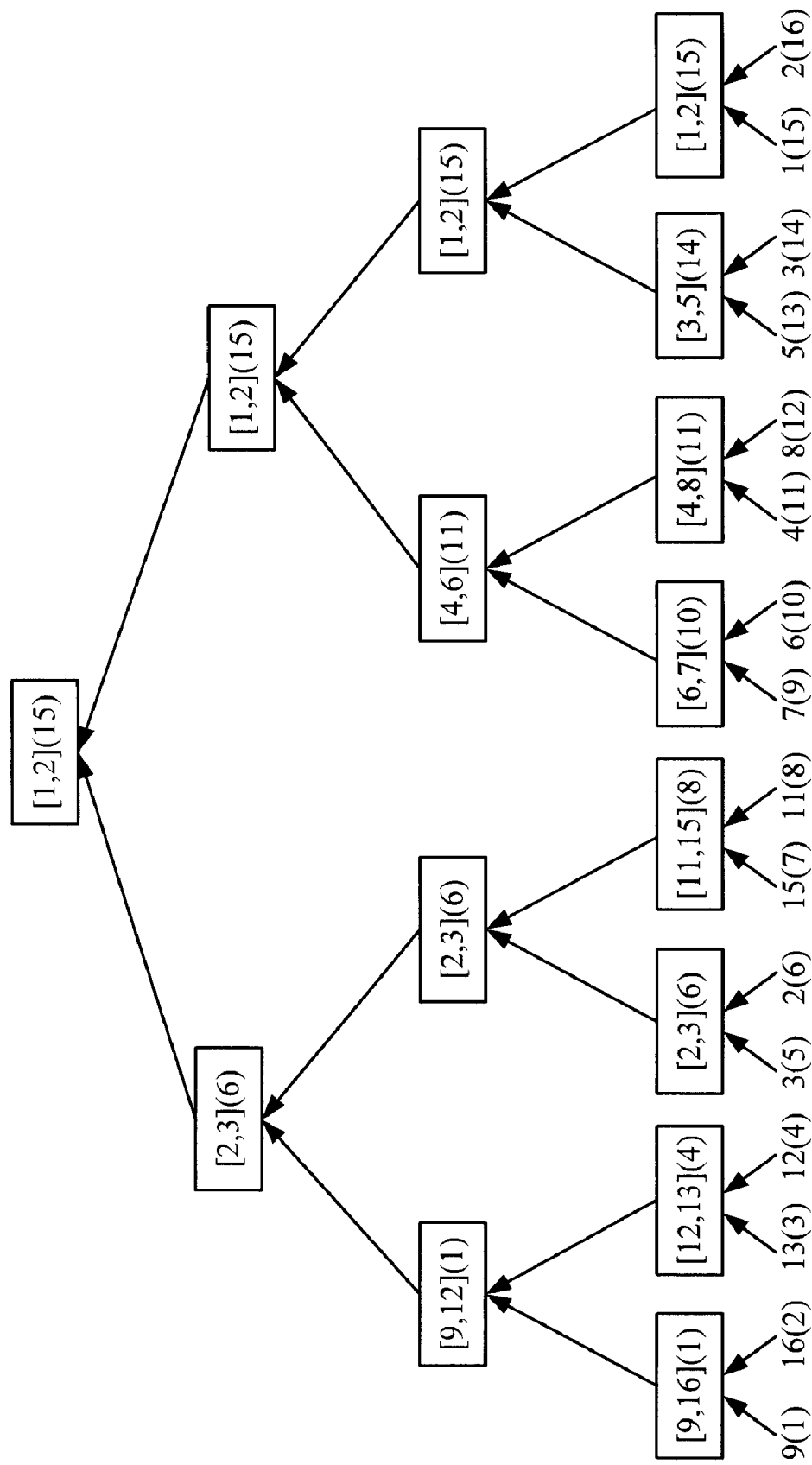
FIG. 4B shows the search method of FIG. 4A according to a preferred embodiment of the present invention.

According to the search method in FIG. 4A, the minimum value, the next minimum value, and the address of the minimum value among $V_1(1), V_2(2) \ldots , V_{16}(16)$ can be searched. The search method according to the present invention can perform searches of the minimum value, the next minimum value, and the address of the minimum value at the same time without the need of waiting completion of search for the minimum value then the next minimum value can be searched. In addition, FIG. 4B is a preferred embodiment of FIG. 4A. As shown in the figure, perform searches according to the M1 and the M2 blocks described above. Finally, the minimum value id searched to be 1, the next minimum value is 2, and the address of the minimum value is 15.

Figure 5A:
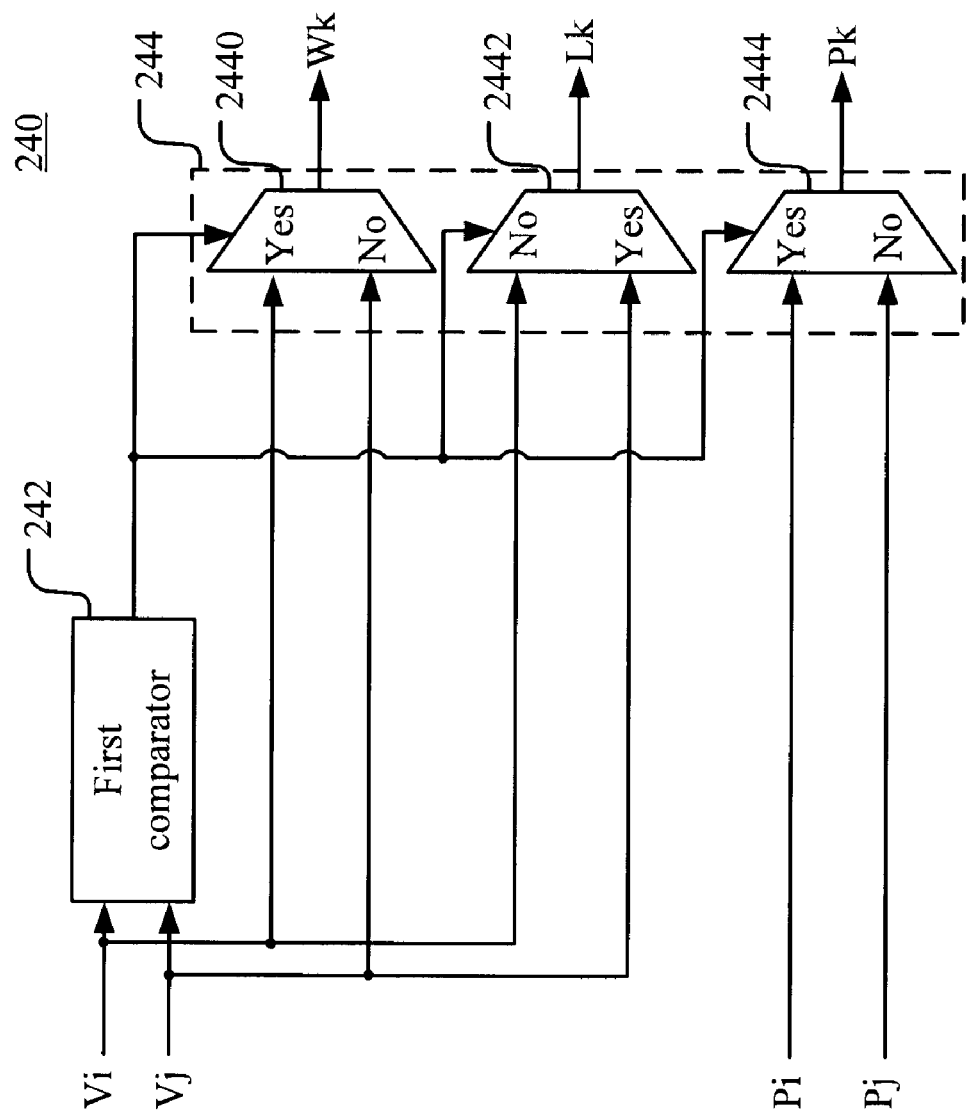
FIG. 5A shows a circuit used for executing the operational steps included in the M1 blocks of FIG. 4A according to a preferred embodiment of the present invention.
Figure 5B:
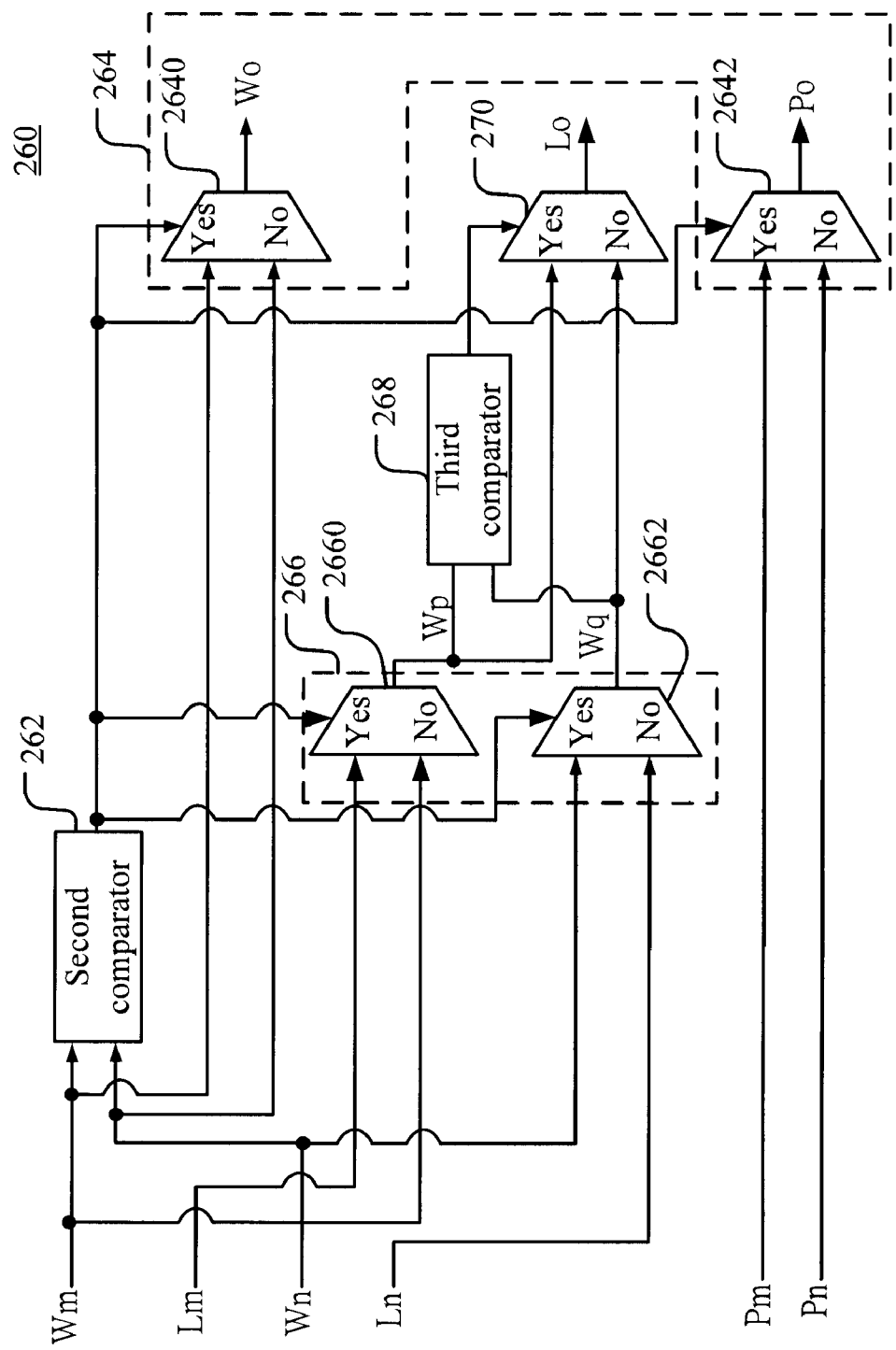
FIG. 5B shows a circuit used for executing the operational steps included in the M2 blocks of FIG. 4A according to a preferred embodiment of the present invention.

FIGS. 5A and 5B show the search circuit in a decoding unit of low-density parity-check codes according to the present invention. As shown in the figures, the circuit in FIG. 5A is a first search circuit 240 of the search circuit 20 in FIGS. 3A and 3B, and is used for realizing the operational steps of the M1 blocks of FIG. 4A. The first search circuit 240 includes a first comparator 242, which is used for comparing if Vi is smaller than Vj and for producing a first comparison signal, and a first multiplexing circuit 244, which is used for outputting a set of compared values according to the first comparison signal. The first multiplexing circuit 244 outputs the smaller of the input values Vi and Vj as the smaller value Wk of the set of compared values, and outputs the greater of the input values Vi and Vj as the greater value Lk of the set of compared values according to the first comparison signal. In addition, the corresponding address of the input value Vi in r input values is Pi, and the corresponding address of the input value Vj in r input values is Pj. The first multiplexing circuit 244 further outputs the corresponding address Pi or Pj of the smaller of the input values Vi and Vj according to the first comparison signal as the corresponding address Pk of the smaller value. The address Pk is transmitted to the second search circuit for performing the operations of M2 blocks shown in FIG. 4A.

In the above description, the first multiplexing circuit 244 includes a first multiplexing unit 2440, which is used for outputting Vi as the smaller value Wk when Vi is smaller than Vj and outputting Vj as the smaller value Wk when Vi is greater than Vj, a second multiplexing unit 2442, which is used for outputting Vj as the greater value Lk when Vi is smaller than Vj and outputting Vi as the greater value Lk when Vi is greater than Vj, and a third multiplexing unit 2444, which is used for outputting Pi as Pk when Vi is smaller than Vj and outputting Pj as Pk when Vi is greater than Vj.

Furthermore, the circuit in FIG. 5B is the second search circuit 260 for implementing the operational steps of the M2 blocks shown in FIG. 4A. The circuit includes a second comparator 262, which is used for comparing if Wm is smaller than Wn, a second multiplexing circuit 264, which is used for outputting the smaller of the smaller values Wm and Wn as a smaller value Wo according to the second comparison signal, and a third multiplexing circuit 266, which is used for outputting a set of compared values Wp and Wq according to the second comparison signal. When the second comparison signal represents that the smaller value Wm is smaller than the smaller value Wn, the third multiplexing circuit 266 outputs the smaller value Wn and the greater value Lm as the set of compared values Wp and Wq. When the second comparison signal represents that the smaller value Wn is smaller than the smaller value Wm, the third multiplexing circuit 266 outputs the smaller value Wm and the greater value Ln as the set of compared values Wp and Wq. In addition, the second search circuit 260 also includes a third comparator 268, which is used for comparing if the compared value Wp is smaller than the compared valued Wq, and for producing a third comparison signal, and a fourth multiplexing circuit 270, which is used for outputting the smaller of the compared values Wp and Wq as a greater value Lo according the third comparison signal. The second search circuit 260 then performs operations according to the smaller value Wo and the greater value Lo to produce the minimum and the next minimum values.

In the description above, the second multiplexing circuit 264 further includes a fourth multiplexing unit 2640, which, according to the second comparison signal, outputs Wm as Wo when Wm is smaller than Wn and outputs Wn as Wo when Wm is greater than Wn, and a fifth multiplexing unit 2642, which outputs the corresponding address Pm or Pn of the smaller of the smaller values Wm and Wn according to the second comparison signal. Besides, the third multiplexing circuit 266 further includes a sixth multiplexing unit 2660 for receiving the second comparison signal, the smaller value Wm, and the greater value Lm. When the second comparison signal represents that the smaller value Wm is smaller than the smaller value Wn, the sixth multiplexing unit 2660 outputs the greater value Lm as the compared value Wp. When the second comparison signal represents that the smaller value Wn is smaller than the smaller value Wm, the sixth multiplexing unit 2660 outputs the smaller value Wm as the compared value Wp. The third multiplexing circuit 266 also includes a seventh multiplexing unit 2662 for receiving the second comparison signal, the smaller value Wn, and the greater value Ln. When the second comparison signal represents that the smaller value Wm is smaller than the smaller value Wn, the seventh multiplexing unit 2662 outputs the smaller value Wn as the compared value Wq. When the second comparison signal represents that the smaller value Wn is smaller than the smaller value Wm, the seventh multiplexing unit 2662 outputs the greater value Ln as the compared value Wq.

Figure 5C:
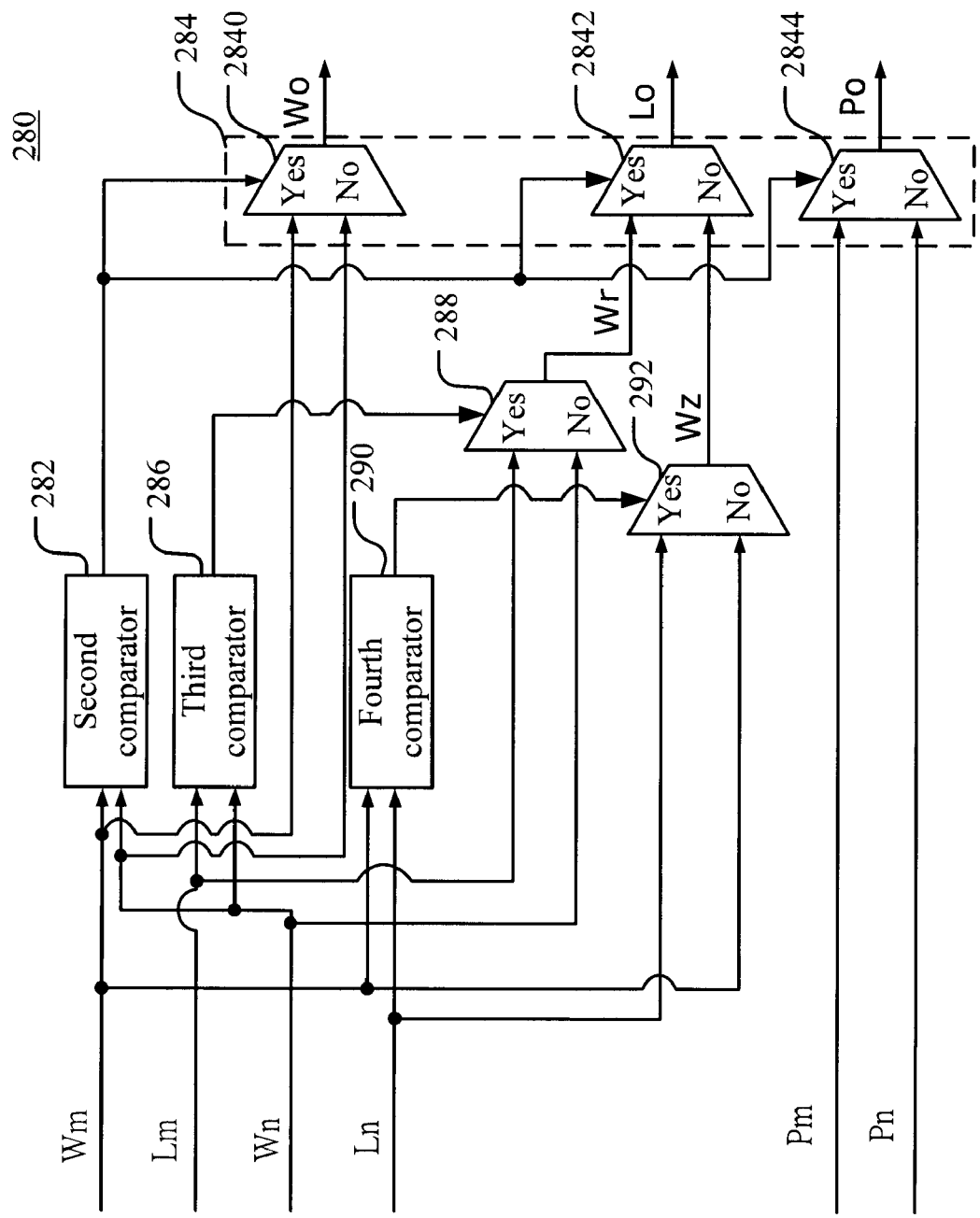
FIG. 5C shows another circuit used for executing the operational steps included in the M2 blocks of FIG. 4A according to another preferred embodiment of the present invention.

FIG. 5C shows another circuit used for executing the operational steps in the M2 blocks of FIG. 4A according to another preferred embodiment of the present invention. A second search circuit 280, which is coupled to the first search circuit 200, is used for performing operations according to every two sets of compared values Wm, Lm, and Wn, Ln in the s sets of compared values, where s is a positive integer smaller than r, the smaller value Wm is smaller than the greater value Lm, and the smaller value Wn is smaller than the greater value Ln. The second search circuit 280 includes a second comparator 282, which is used for comparing if the smaller value Wm is smaller than the smaller value Wn and for producing a second comparison signal, a second multiplexing circuit 284, which is used for outputting the smaller of the smaller values Wm and Wn as a smaller value Wo according to the second comparison signal, a third comparator 286, which is used for comparing if the greater value Lm is smaller than the smaller value Wn and for producing a third comparison signal, a third multiplexing circuit 288, which is used for outputting the smaller of the greater value Lm and the smaller value Wn as a smaller value Wr according to the third comparison signal, a fourth comparator 290, which is used for comparing if the smaller value Wm is smaller than the greater value Ln and for producing a fourth comparison signal, and a fourth multiplexing circuit 292, which is used for outputting the smaller of the smaller value Wm and the greater value Ln as a smaller value Wz according to the fourth comparison signal. The second multiplexing circuit 284 further outputs the smaller of the smaller values Wr and Wz as a greater value Lo according to the second comparison signal, and the second search circuit 280 produces the minimum and the next minimum values according to the smaller value Wo and the greater value Lo.

The second multiplexing circuit 284 further includes a fourth multiplexing unit 2840, which is used for outputting the smaller of the smaller values Wm and Wn as the smaller value according to the second comparison signal, a fifth multiplexing unit 2842, which is used for outputting the smaller of the smaller values Wr and Wz as the greater value Lo according to the second comparison signal, and a sixth multiplexing unit 2844, which is used for outputting the corresponding address Pm or Pn of the smaller of the smaller values Wm and Wn according to the second comparison signal.

To sum up, the search circuit and the method thereof disclosed in the present invention can search the minimum value, the next minimum value, and the address of the minimum value at the same time without the need of waiting completion of search for the minimum value then the next minimum value can be searched.

Accordingly, the present invention conforms to the legal requirements owing to its novelty, non-obviousness, and utility. However, the foregoing description is only a preferred embodiment of the present invention, not used to limit the scope and range of the present invention. Those equivalent changes or modifications made according to the shape, structure, feature, or spirit described in the claims of the present invention are included in the appended claims of the present invention.

The invention claimed is:

1. A search method, performed by a tangible search circuit in a decoding unit of low-density parity check codes, used for searching a minimum value and a next minimum value from r input values, where r is an integer greater than 3, comprising:
   performing operations on two input values V1, V2 of the r input values, comprising:
      comparing the two input values V1 and V2;
      determining the input value V1 as a smaller value Wm and the input value V2 as a greater value Lm, if the input value V1 is smaller than the input value V2; and
      determining the input value V2 as the smaller value Wm and the input value V1 as the greater value Lm, if the input value V2 is smaller than the input value V1;
   performing operations on two input values V3, V4 of the r input values, comprising:
      comparing the two input values V3 and V4;
      determining the input value V3 as a smaller value Wn and the input value V4 as a greater value Ln, if the input value V3 is smaller than the input value V4; and
      determining the input value V4 as the smaller value Wn and the input value V3 as the greater value Ln, if the input value V4 is smaller than the input value V3;
   performing operations according to the smaller value Wm, the smaller value Wn, the greater value Lm, and the greater value Ln, comprising:
      generating a first comparison signal that indicates the smaller of the smaller value Wm and the smaller value Wn;
      selecting one of the greater value Lm and the smaller value Wm as a compared value Wp in a first multiplexing circuit according to the first comparison signal;
      selecting one of the greater value Ln and the smaller value Wn as a compared value Wq in a second multiplexing circuit according to the first comparison signal;
      generating a second comparison signal that indicates the smaller of the compared value Wp and the compared value Wq;
      selecting one of the compared value Wp and the compared value Wq as a greater value Lo in a third multiplexing circuit according to the second comparison signal; and
      selecting one of the smaller value Wm and the smaller value Wn as a smaller value Wo in a fourth multiplexing circuit according to the first comparison signal; and
   producing the minimum value and the next minimum value according to the smaller value Wo and the greater value Lo.

2. The method of claim 1, and further comprising:
   determining a corresponding address Pm of the smaller value Wm in the r input values as an address Po of the smaller value, if the smaller value Wm is smaller than the smaller value Wn; and
   determining a corresponding address Pn of the smaller value Wn in the r input values as the address Po of the smaller value, if the smaller value Wn is smaller than the smaller value Wm.

3. A search circuit, used for searching a minimum value and a next minimum value from r input values, where r is an integer greater than 3, comprising:
   a first search circuit, used for performing operations on each pair of input values Vi, Vj of the r input values, respectively, comprising:
      a first comparator, used for comparing if the input value Vi is smaller than the input value Vj, and for producing a first comparison signal; and
      a first multiplexing circuit, used for outputting a set of compared values according to the first comparison signal, outputting the smaller of the input value Vi and the input value Vj as the smaller value of the set of compared values, and outputting the greater of the Vi and Vj as the greater value of the set of compared values according to the first comparison signal;
   a second search circuit, coupled to the first search circuit, used for performing operations on every two sets of compared values Wm, Lm, and Wn, Ln of s compared values, where s is a positive integer smaller than r, the smaller value Wm being smaller than the greater value Lm, the smaller value Wn being smaller than the greater value Ln, and comprising:
      a second comparator, used for comparing if the smaller value Wm is smaller than the smaller value Wn, and for producing a second comparison signal;
      a second multiplexing circuit, used for outputting the smaller of the smaller value Wm and the smaller value Wn as a smaller value Wo according to the second comparison signal;
      a third multiplexing circuit, used for outputting a set of compared values Wp, Wq according to the second comparison signal, outputting the smaller value Wn and the greater value Lm as the set of compared values Wp, Wq when the second comparison signal represents that the smaller value Wm is smaller than the smaller value Wn, and outputting the smaller value Wm and the greater value Ln as the set of compared values Wp, Wq when the second comparison signal represents that the smaller value Wn is smaller than the smaller value Wm;
      a third comparator, used for comparing if the compared value Wp is smaller than the compared value Wq and for producing a third comparison signal; and
      a fourth multiplexing circuit, used for outputting the smaller of the compared value Wp and the compared value Wq as a greater value Lo according to the third comparison signal;
      wherein the second search circuit produces the minimum value and the next minimum value according to the smaller value Wo and the greater value Lo.

4. The search circuit of claim 3, wherein the first multiplexing circuit includes:
   a first multiplexing unit, used for outputting the smaller of the input value Vi and the input value Vj according to the first comparison signal; and
   a second multiplexing unit, used for outputting the greater of the input value Vi and the input value Vj according to the first comparison signal.

5. The search circuit of claim 3, wherein a corresponding address of the input value Vi in the r input values is Pi, a corresponding address of the input value Vj in the r input values is Pj, and the first multiplexing circuit further outputting the corresponding address Pi or Pj of the smaller of the input value Vi and the input value Vj to the second search circuit according to the first comparison signal.

6. The search circuit of claim 5, wherein the first multiplexing circuit further comprising a third multiplexing unit, outputting the corresponding address Pi or Pj of the smaller of the input value Vi and the input value Vj to the second search circuit according to the first comparison signal.

7. The search circuit of claim 6, wherein a corresponding address of the smaller value Wm is Pm, a corresponding address of the smaller value Wn is Pn, and the second multiplexing circuit further outputting the corresponding address Pm or Pn of the smaller of the smaller value Wm and the smaller value Wn according to the second comparison signal.

8. The search circuit of claim 7, wherein the second multiplexing circuit includes:
   a fourth multiplexing unit, used for outputting the smaller of the smaller value Wm and the smaller value Wn according to the second comparison signal; and
   a fifth multiplexing unit, used for outputting the corresponding address Pm or Pn of the smaller of the smaller value Wm and the smaller value Wn according to the second comparison signal.

9. The search circuit of claim 3, wherein the third multiplexing circuit includes:
   a sixth multiplexing unit, used for receiving the second comparison signal, the smaller value Wm, and the greater value Lm, outputting the greater value Lm when the second comparison signal represents that the smaller value Wm is smaller than the smaller value Wn, and outputting the smaller value Wm when the second comparison signal represents that the smaller value Wn is smaller than the smaller value Wm; and
   a seventh multiplexing unit, used for receiving the second comparison signal, the smaller value Wn, and the greater value Ln, outputting the smaller value Wn when the second comparison signal represents that the smaller value Wm is smaller than the smaller value Wn, and outputting the greater value Ln when the second comparison signal represents that the smaller value Wn is smaller than the smaller value Wm.

10. A search circuit, used for searching a minimum value and a next minimum value from r input values, where r is an integer greater than 3, comprising:
   a first search circuit, used for performing operations on each pair of input values Vi, Vj of the r input values, respectively, comprising:
      a first comparator, used for comparing if the input value Vi is smaller than the input value Vj, and for producing a first comparison signal; and
      a first multiplexing circuit, used for outputting a set of compared values according to the first comparison signal, outputting the smaller of the input value Vi and the input value Vj as the smaller value of the set of compared values, and outputting the greater of the Vi and Vj as the greater value of the set of compared values according to the first comparison signal; and
   a second search circuit, coupled to the first search circuit, used for performing operations on every two sets of compared values Wm, Lm, and Wn, Ln of s compared values, where s is a positive integer smaller than r, the smaller value Wm being smaller than the greater value Lm, the smaller value Wn being smaller than the greater value Ln, and comprising:
      a second comparator, used for comparing if the smaller value Wm is smaller than the smaller value Wn, and for producing a second comparison signal;
      a second multiplexing circuit, used for outputting the smaller of the smaller value Wm and the smaller value Wn as a smaller value Wo according to the second comparison signal;
      a third comparator, used for comparing if the greater value Lm is smaller than the smaller value Wn and for producing a third comparison signal;
      a third multiplexing circuit, used for outputting the smaller of the greater value Lm and the smaller value Wn as a smaller value Wr;
      a fourth comparator, used for comparing if the smaller value Wm is smaller than the greater value Ln and for producing a fourth comparison signal; and
      a fourth multiplexing circuit, used for outputting the smaller of the smaller value Wm and the greater value Ln as a smaller value Wz according to the fourth comparison signal;
   wherein the second multiplexing circuit further outputs the smaller of the smaller value Wr and the smaller value Wz as a greater value Lo according to the second comparison signal, and the second search circuit produces the minimum value and the next minimum value according to the smaller value Wo and the greater value Lo.

11. The search circuit of claim 10, wherein the first multiplexing circuit includes:
   a first multiplexing unit, used for outputting the smaller of the input value Vi and the input value Vj according to the first comparison signal; and
   a second multiplexing unit, used for outputting the greater of the input value Vi and the input value Vj according to the first comparison signal.

12. The search circuit of claim 10, wherein a corresponding address of the input value Vi in the r input values is Pi, a corresponding address of the input value Vj in the r input values is Pj, and the first multiplexing circuit further outputting the corresponding address Pi or Pj of the smaller of the input value Vi and the input value Vj to the second search circuit according to the first comparison signal.

13. The search circuit of claim 12, wherein the first multiplexing circuit further comprising a third multiplexing unit, outputting the corresponding address Pi or Pj of the smaller of the input value Vi and the input value Vj to the second search circuit according to the first comparison signal.

14. The search circuit of claim 12, wherein a corresponding address of the smaller value Wm is Pm, a corresponding address of the smaller value Wn is Pn, and the second multiplexing circuit further outputting the corresponding address Pm or Pn of the smaller of the smaller value Wm and the smaller value Wn according to the second comparison signal.

15. The search circuit of claim 14, wherein the second multiplexing circuit includes:
   a fourth multiplexing unit, used for outputting the smaller of the smaller value Wm and the smaller value Wn as the smaller value Wo according to the second comparison signal;
   a fifth multiplexing unit, used for outputting the smaller of the smaller value Wr and the smaller value Wz as the greater value Lo according to the second comparison signal;
   a sixth multiplexing unit, used for outputting the corresponding address Pm or Pn of the smaller of the smaller value Wm and the smaller value Wn according to the second comparison signal.

16. The search circuit of claim 10, wherein the second multiplexing circuit includes:
   a fourth multiplexing unit, used for outputting the smaller of the smaller value Wm and the smaller value Wn as the smaller value Wo according to the second comparison signal; and
   a fifth multiplexing unit, used for outputting the smaller of the smaller value Wr and the smaller value Wz as the greater value Lo according to the second comparison signal.

* * * * *